US010197907B2

(12) United States Patent
Hassan et al.

(10) Patent No.: US 10,197,907 B2
(45) Date of Patent: Feb. 5, 2019

(54) EXTREME ULTRAVIOLET MASK BLANK PRODUCTION SYSTEM WITH THIN ABSORBER AND MANUFACTURING SYSTEM THEREFOR (71) Applicant: Applied Materials, Inc., Santa Clara, CA (US)

(72) Inventors: Vinayak Vishwanath Hassan, Santa Clara, CA (US); Majeed A. Foad, Sunnyvale, CA (US); Cara Beasley, Scotts Valley, CA (US); Ralf Hofmann, Soquel, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 7 days.

(21) Appl. No.: 15/438,248

(22) Filed: Feb. 21, 2017

(65) Prior Publication Data
US 2017/0160632 A1    Jun. 8, 2017

Related U.S. Application Data (63) Continuation of application No. 14/620,114, filed on Feb. 11, 2015, now Pat. No. 9,612,522.

(60) Provisional application No. 62/023,496, filed on Jul. 11, 2014.

(51) Int. Cl.
G03F 1/22    (2012.01)
G03F 1/24    (2012.01)
G03F 7/20    (2006.01)
C23C 14/04   (2006.01)
C23C 16/04   (2006.01)
C23C 28/00   (2006.01)

(52) U.S. Cl.
CPC .............. *G03F 1/24* (2013.01); *C23C 14/042* (2013.01); *C23C 16/042* (2013.01); *C23C 28/00* (2013.01); *C23C 28/322* (2013.01); *C23C 28/34* (2013.01); *C23C 28/42* (2013.01); *C23C 28/44* (2013.01); *G03F 1/22* (2013.01); *G03F 7/70033* (2013.01)

(58) Field of Classification Search
USPC ........................................................... 430/5
See application file for complete search history.

(56) References Cited

U.S. PATENT DOCUMENTS

| | | | |
|---|---|---|---|
| 8,691,476 B2 | 4/2014 | Yu et al. | |
| 8,802,335 B2 | 8/2014 | Oh et al. | |
| 8,932,785 B2 | 1/2015 | Utzny | |
| 2004/0151988 A1 | 8/2004 | Silverman | |
| 2005/0084773 A1 | 4/2005 | Krauth | |
| 2007/0020903 A1 | 1/2007 | Takehara et al. | |
| 2010/0167181 A1 | 7/2010 | Kim | |
| 2011/0020737 A1* | 1/2011 | Kamo | B82Y 10/00 430/5 |
| 2011/0104595 A1 | 5/2011 | Hayashi et al. | |
| 2012/0129083 A1 | 5/2012 | Yoshimori et al. | |
| 2014/0192335 A1 | 7/2014 | Hagio et al. | |
| 2014/0212794 A1 | 7/2014 | Maeshige et al. | |
| 2014/0268080 A1 | 9/2014 | Beasley et al. | |
| 2016/0011499 A1 | 1/2016 | Hassan et al. | |
| 2016/0011500 A1 | 1/2016 | Hassan et al. | |

FOREIGN PATENT DOCUMENTS

JP    2013120868 A    6/2013

OTHER PUBLICATIONS

Extended European Search Report in EP15819417.5 dated Nov. 2, 2017, 11 pages.
Non-Final Office Action in U.S. Appl. No. 14/620,114 dated Jul. 22, 2016, 15 pages.
PCT International Preliminary Report on Patentability in PCT/US2015/039525 dated Jan. 26, 2017, 9 pages.
PCT International Preliminary Report on Patentability in PCT/US2015/039533 dated Jan. 26, 2017, 10 pages.
PCT International Search Report and Written Opinion in PCT/US2015/039525 dated Sep. 18, 2015, 10 pages.
PCT International Search Report and Written Opinion in PCT/US2015/039533 dated Sep. 21, 2015, 11 pages.

* cited by examiner

*Primary Examiner* — Christopher G Young
(74) *Attorney, Agent, or Firm* — Servilla Whitney LLC (57) ABSTRACT An extreme ultraviolet (EUV) mask blank production system includes: a substrate handling vacuum chamber for creating a vacuum; a substrate handling platform, in the vacuum, for transporting an ultra-low expansion substrate loaded in the substrate handling vacuum chamber; and multiple sub-chambers, accessed by the substrate handling platform, for forming an EUV mask blank includes: a multi-layer stack, formed above the ultra-low expansion substrate, for reflecting an extreme ultraviolet (EUV) light, and an absorber layer, formed above the multi-layer stack, for absorbing the EUV light at a wavelength of 13.5 nm includes the absorber layer has a thickness of less than 80 nm and less than 2% reflectivity.

19 Claims, 6 Drawing Sheets

EXTREME ULTRAVIOLET MASK BLANK PRODUCTION SYSTEM WITH THIN ABSORBER AND MANUFACTURING SYSTEM THEREFOR

CROSS-REFERENCE TO RELATED APPLICATION(S)

This application is a continuation of U.S. Non-Provisional application Ser. No. 14/620,114, filed Feb. 11, 2015, which claims the benefit of U.S. Provisional Patent Application Ser. No. 62/023,496 filed Jul. 11, 2014, to each of which priority is claimed and each of which are incorporated herein by reference in their entireties.

The present application contains subject matter related to a concurrently filed U.S. patent application Ser. No. 14/620,123 filed Feb. 11, 2015. The related application is assigned to Applied Materials, Inc. and the subject matter thereof is incorporated herein by reference thereto.

TECHNICAL FIELD

The present invention relates generally to extreme ultraviolet lithography blanks, and manufacturing and lithography systems for such extreme ultraviolet lithography blanks.

BACKGROUND

Extreme ultraviolet lithography (EUV, also known as soft x-ray projection lithography) is a contender to replace deep ultraviolet lithography for the manufacture of 0.0135 micron, and smaller, minimum feature size semiconductor devices.

However, extreme ultraviolet light, which is generally in the 5 to 100 nanometer wavelength range, is strongly absorbed in virtually all materials. For that reason, extreme ultraviolet systems work by reflection rather than by transmission of light. Through the use of a series of mirrors, or lens elements, and a reflective element, or mask blank, coated with a non-reflective absorber mask pattern, the patterned actinic light is reflected onto a resist-coated semiconductor substrate.

The lens elements and mask blanks of extreme ultraviolet lithography systems are coated with reflective multilayer coatings of materials such as molybdenum and silicon. Reflection values of approximately 65% per lens element, or mask blank, have been obtained by using substrates that are coated with multilayer coatings that strongly reflect light within an extremely narrow ultraviolet bandpass; e.g., 12.5 to 14.5 nanometer bandpass for 13.5 nanometer ultraviolet light.

In view of the need for the increasingly smaller feature size of electronic components, it is increasingly critical that answers be found to these problems. In view of the ever-increasing commercial competitive pressures, along with growing consumer expectations, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention is an extreme ultraviolet (EUV) mask blank production system provides: a substrate handling vacuum chamber for creating a vacuum; a substrate handling platform, in the vacuum, for transporting an ultra-low expansion substrate loaded in the substrate handling vacuum chamber; and multiple sub-chambers, accessed by the substrate handling platform, for forming an EUV mask blank including: a multi-layer stack, formed above the ultra-low expansion substrate, for reflecting an extreme ultraviolet (EUV) light, and an absorber layer, formed above the multi-layer stack, for absorbing the EUV light at a wavelength of 13.5 nm includes the absorber layer has a thickness of less than 80 nm and less than 2% reflectivity.

An embodiment of the present invention is an extreme ultraviolet (EUV) mask blank system provides: an ultra-low expansion substrate; a multi-layer stack over the ultra-low expansion substrate; and an absorber layer, over the multi-layer stack, with a thickness of less than 80 nm and less than 2% reflectivity of an extreme ultraviolet (EUV) light at a wavelength of 13.5 nm.

Certain embodiments of the invention have other steps or elements in addition to or in place of those mentioned above. The steps or element will become apparent to those skilled in the art from a reading of the following detailed description when taken with reference to the accompanying drawings.

The light source for the next generation lithography is moving on from 193 nm wavelength to an extreme ultraviolet source of 13.5 nm. As a result, the mask blank will move from transmission to the reflection geometry. The structure of the mask blank can be a Molybdenum (Mo)/Silicon (Si) multi-layer structure with a period spacing designed for maximum reflection at 13.5 nm wavelength. An EUV mask blank is a complex structure, which controls the behavior of light in each layer. Some regions of the mask will reflect light and others will absorb. The region where light reflects is due to the constructive interference from each interface in the periodic structure of the multilayer, with minimum absorption. And the region where light is absorbed is due to a combination of thin film absorption and destructive interference from the absorber and the multi-layer structure underneath. Embodiments disclose single layered films which acts as an absorber for a radiation centered at 13.5 nm with a bandwidth of 0.5 nm.

DETAILED DESCRIPTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features will be described with similar reference numerals.

For expository purposes, the term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" indicates that there is direct contact between elements.

The term "processing" as used herein includes deposition of material or photoresist, patterning, exposure, development, etching, cleaning, and/or removal of the material or photoresist as required in forming a described structure.

Figure 1:
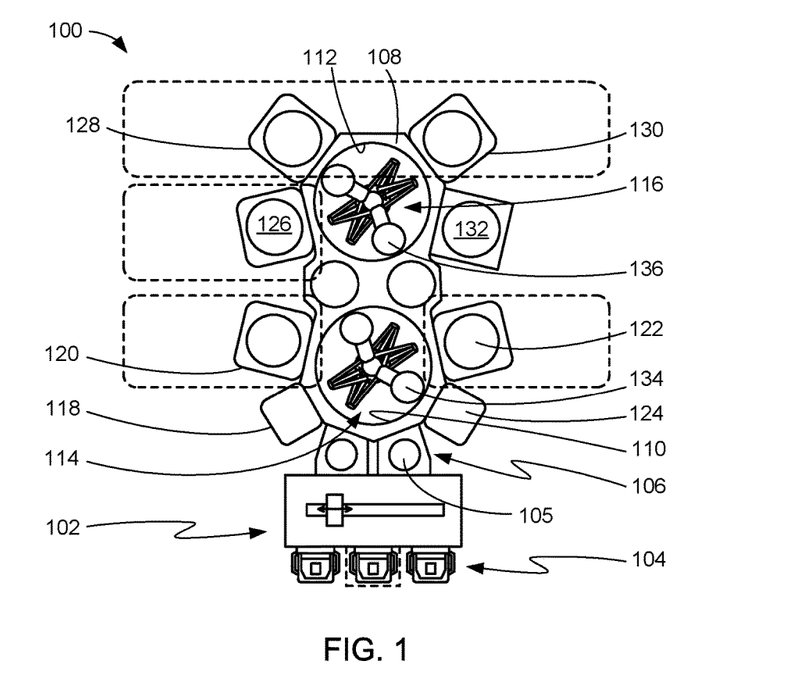
FIG. 1 is an extreme ultraviolet (EUV) mask production system.

Referring now to FIG. 1, therein is shown an integrated extreme ultraviolet (EUV) mask blank production system 100. The integrated EUV mask blank production system 100 includes a mask blank loading and carrier handling system 102 having load ports 104 into which transport boxes containing substrates 105, such as substrates of glass, silicon, or other ultra-low thermal expansion material, are loaded. An airlock 106 provides access to a substrate handling vacuum chamber 108. In an embodiment, the substrate handling vacuum chamber 108 can contain two vacuum chambers, a first vacuum chamber 110 and a second vacuum chamber 112. The first vacuum chamber 110 can contain a first substrate handling platform 114 and the second vacuum chamber 112 can contain a second substrate handling platform 116.

The substrate handling vacuum chamber 108 can have a plurality of ports around its periphery for attachment of various subsystems. The first vacuum chamber 110 can, for example, have a degas subsystem 118, a first physical vapor deposition sub-chamber 120 such as an absorber layer deposition chamber, a second physical vapor deposition sub-chamber 122 such as a backside chucking layer deposition chamber, and a preclean subsystem 124.

The second vacuum chamber 112 can have a first multi-cathode sub-chamber 126 such as a multilayer deposition chamber, a flowable chemical vapor deposition (FCVD) sub-chamber 128 such as a planarization layer deposition chamber, a cure sub-chamber 130, and a second multi-cathode sub-chamber 132 connected to it.

The first substrate handling platform 114 is capable of moving an ultra-low expansion substrate, such as a first in-process substrate 134, among the airlock 106 and the various subsystems around the periphery of the first vacuum chamber 110 and through slit valves, not shown, in a continuous vacuum. The second substrate handling platform 116 can move an ultra-low expansion substrate, such as a second in-process substrate 136, around the second vacuum chamber 112 while maintaining the second in-process substrate 136 in a continuous vacuum.

It has been discovered that the integrated EUV mask blank production system 100 can provide an environment for manufacturing EUV mask blanks, while minimizing the manual transport of the first in-process substrate 134 and the second in-process substrate 136.

Figure 2:
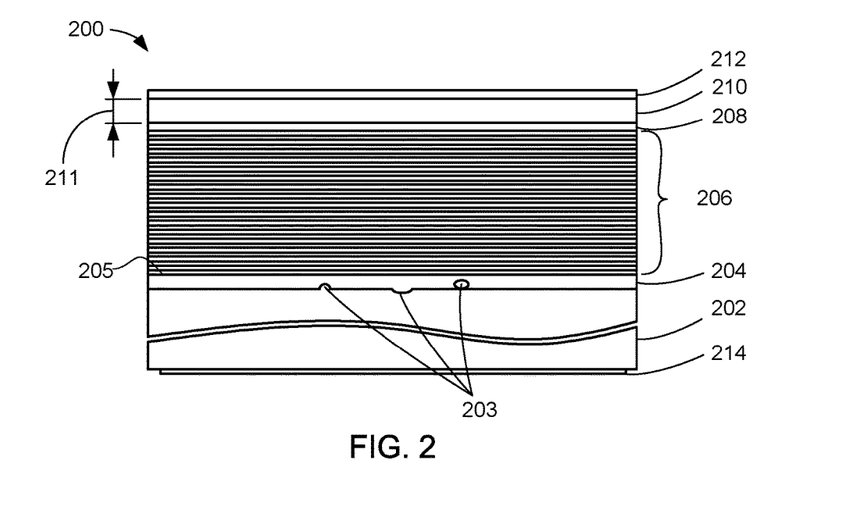
FIG. 2 is a cross-sectional view of an EUV mask blank in accordance with an embodiment.

Referring now to FIG. 2, therein is shown a cross-sectional view of an EUV mask blank 200 in accordance with an embodiment. The EUV mask blank 200 can have an ultra-low thermal expansion substrate 202 of glass, silicon, or other ultra-low thermal expansion material. The ultra-low thermal expansion materials include fused silica, fused quartz, calcium fluoride, silicon carbide, silicon oxide-titanium oxide, or other material having a thermal coefficient of expansion within the range of these materials.

It has been discovered that a planarization layer 204 can be used for filling surface imperfections 203, such as pits and/or defects in the ultra-low expansion substrate 202, covering particles on top of the ultra-low expansion substrate 202, or smoothing an already planarized surface of the ultra-low expansion substrate 202 to form a planar surface 205.

A multi-layer stack 206 can be formed on the planarization layer 204 to form a Bragg reflector. Due to the absorptive nature of the illuminating wavelengths used in EUV, reflective optics are used. The multi-layer stack 206 may be made of alternating layers of high-Z and low-Z materials, such as molybdenum and silicon in order to form a reflector.

A capping layer 208 is formed on the multi-layer stack 206 opposite the ultra-low expansion substrate 202 for forming a capped Bragg reflector. The capping layer 208 can be a material such as Ruthenium (Ru) or a non-oxidized compound thereof to help protect the multi-layer stack 206 from oxidation and any chemical etchants to which the EUV mask blank 200 may be exposed during subsequent mask processing. Other material such as titanium nitride, boron carbide, silicon nitride, ruthenium oxide, and silicon carbide may also be used in the capping layer 208.

An absorber layer 210 can be formed on the capping layer 208. The absorber layer 210 can be of a material having a high absorption coefficient for a particular frequency of EUV light (about 13.5 nm) and may be a material such chromium, tantalum or nitrides thereof. As an example, a thickness 211 of the absorber layer 210, formed of chromium, tantalum or nitrides thereof, can be greater than 80 nm. The absorber layer 210, formed of chromium, tantalum or nitrides thereof, can have a reflectivity of greater than 2%.

The absorber layer 210 must be kept as thin as possible in order to reduce the surface parallax that causes shadowing in a mask formed on the EUV mask blank. One of the limitation with the absorber layer 210, formed of chromium, tantalum or nitrides thereof having the thickness 211 greater than 80 nm, is that the angle of incidence of the EUV light can cause shadowing which limits that pattern size that can achieved in an integrated circuit produced by a mask using the EUV mask blank, which limits the size of integrated circuit devices that can be fabricated.

The absorber layer 210 can be formed of a single layer of less than 80 nm by using one of the following metals Nickel (Ni), Platinum (Pt), Silver (Ag), Zinc (Zn), Tin (Sn), Gold (Au), Hafnium (Hf), Lead (Pb), Indium (In), Cadmium (Cd), or semimetals Bismuth (Bi), Antimony (Sb), and Tellurium (Te), The material of the absorber layer 210 are chosen for their absorption characteristics at 13.5 nm and for their ability to be etched. The absorber layer 210 can be deposited by PVD, CVD, ALD, RF, and DC magnetron sputtering techniques. The absorber layer 210 can operate by a combination of thin film absorption and destructive interference of the EUV light.

The percent of reflectivity, provided by the EUV mask blank 200, can be controlled by managing the thickness 211 of the absorber layer 210. By way of an example, percent of reflectivity of the EUV light at the wavelength of 13.5 nm can be controlled to 5%, 3%, 1%, or 0.5% based on the thickness 211 of the absorber layer 210.

An anti-reflective coating (ARC) 212 can be deposited on the absorber layer 210. The ARC 212 can be of a material such as tantalum oxynitride or tantalum boron oxide.

A backside chucking layer 214 can be formed on the back-side surface of the ultra-low expansion substrate 202, opposite the planarization layer 204, for mounting the substrate on or with an electrostatic chuck (not shown).

Figure 3:
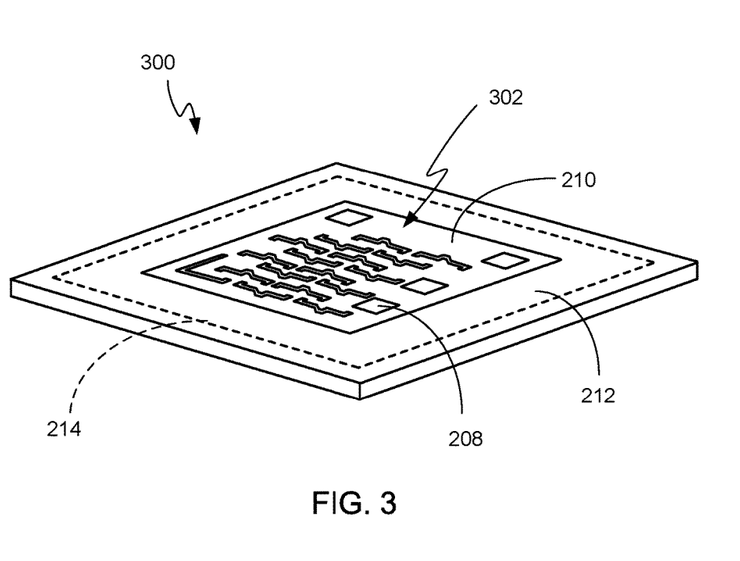
FIG. 3 is an orthogonal view of an EUV mask.

Referring now to FIG. 3, therein is shown an orthogonal view of an EUV mask 300. The EUV mask 300 can be a rectangular shape and can have a pattern 302 on the top surface thereof. The pattern 302 can be etched into the ARC 212 and the absorber layer 210 to expose the capping layer 208, for representing the geometry associated with a step in the manufacturing of an integrated circuit, not shown. The backside chucking layer 214 can be applied on the backside of the EUV mask 300 opposite the pattern 302.

Figure 4:
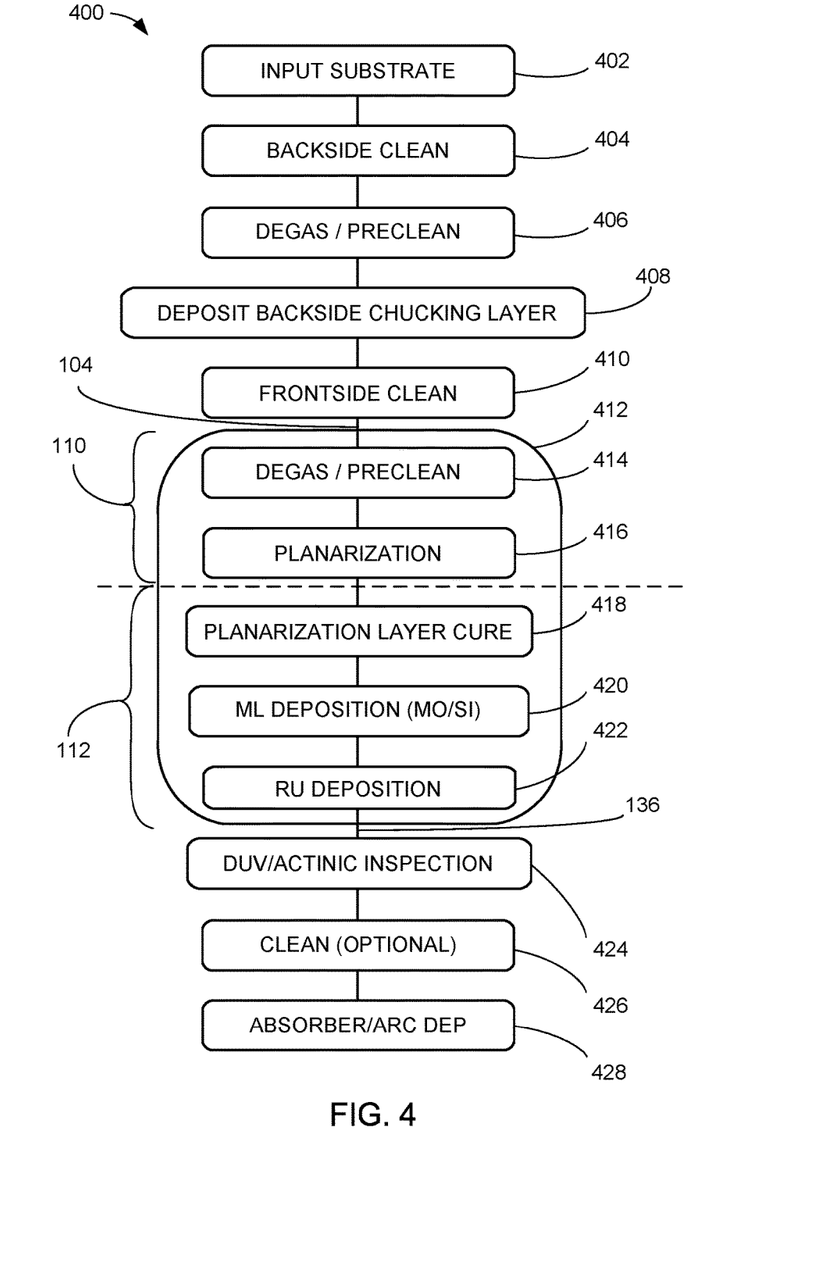
FIG. 4 is a flow chart of a method for making the EUV mask blank with ultra-low defects.

Referring now to FIG. 4, therein is shown a flow chart of a method 400 for making the EUV mask blank 200 with ultra-low defects. The ultra-low defects are substantially zero defects. The method 400 includes the ultra-low expansion substrate 202 of FIG. 2 being supplied at an input substrate step 402. The ultra-low expansion substrate 202 can be backside cleaned in a substrate cleaning step 404, degassed and pre-cleaned in a backside prep step 406.

The backside chucking layer 214 of FIG. 2 is applied to the back-side of the ultra-low expansion substrate 202 in a deposit backside chucking layer step 408 and a front-side clean can be performed in a front-side cleaning step 410. The substrates 105, after the front-side cleaning step 410, can be input to the first vacuum chamber 110 for further processing. The steps of forming a capped Bragg reflector 412 are better performed in the integrated EUV mask blank production system 100 of FIG. 1 while under continuous vacuum to avoid contamination from ambient conditions.

A degas and preclean step 414 and planarization step 416 can be performed in the first vacuum chamber 110. The planarization layer 204 of FIG. 2 can be cured in a planarization layer cure step 418 and the deposition of the multi-layer stack 206 of FIG. 2 can be performed in a depositing the multi-layer stack step 420. Both the planarization layer cure step 418 and the multi-layer stack step 420 can be performed in the second vacuum chamber 112. The capping layer 208 of FIG. 2 can be deposited in a depositing a capping layer step 422 within the second vacuum chamber 112 for forming the second in-process substrate 136, such as the capped Bragg reflector.

After exiting the integrated EUV mask blank production system 100, the second in-process substrate 136 is subjected to a deep ultraviolet (DUV)/Actinic inspection, which can be performed in an inspection step 424, the second in-process substrate 136 can be optionally cleaned in a second front-side cleaning step 426, and the absorber layer 210 of FIG. 2 and anti-reflective coating 212 of FIG. 2 can be deposited in an EUV mask blank completion step 428 for forming the EUV mask blank 200 of FIG. 2.

It has been discovered that the integrated EUV mask blank production system 100 can produce the EUV mask blank 200 consistently with substantially zero defects. The Application of the planarization layer 204 in the first vacuum chamber 110 and the curing of the planarization layer 204 in the second vacuum chamber 112 can improve the efficiency of the integrated EUV mask blank production system 100 because the chambers do not require thermal ramp time between the deposition of the planarization layer 204 and its curing.

Figure 5:
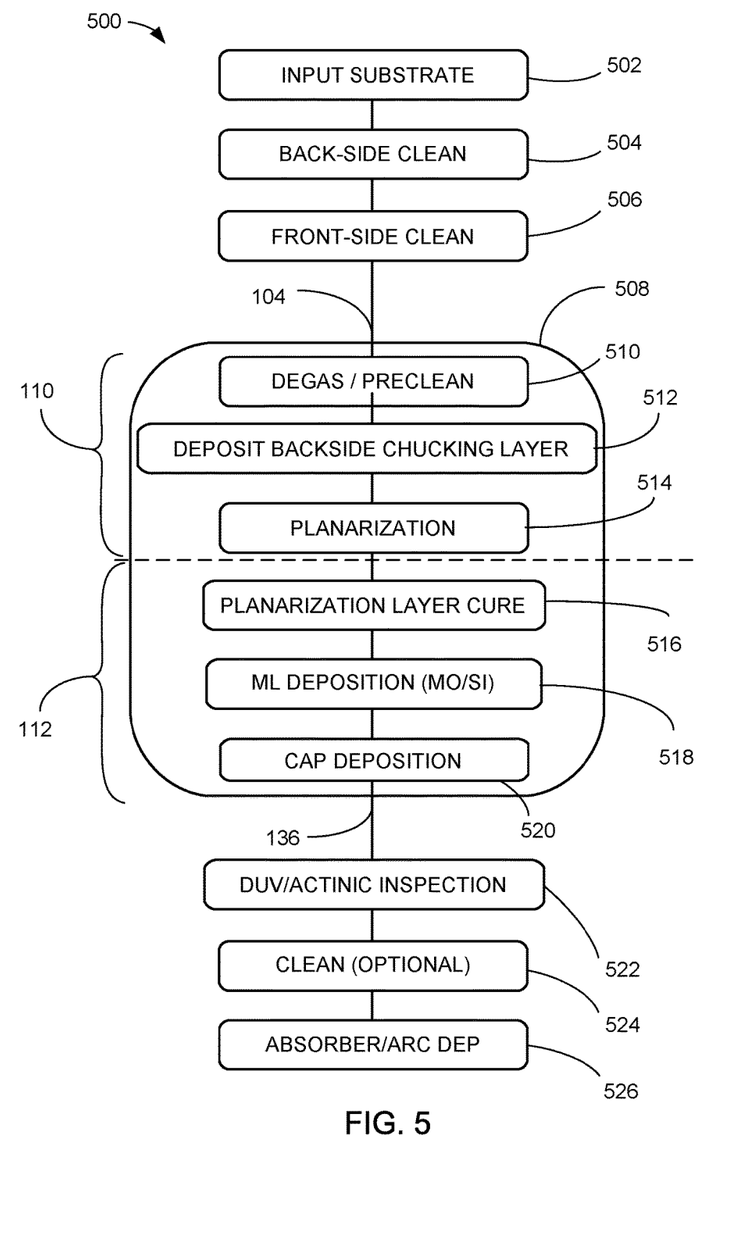
FIG. 5 is a flow chart of an alternative method for making the EUV mask blank with ultra-low defects.

Referring now to FIG. 5, therein is shown a flow chart of an alternative method 500 for making the EUV mask blank 200 with ultra-low defects. The ultra-low defects are substantially zero defects. The alternative method 500 begins with the ultra-low expansion substrate 202 of FIG. 2 being supplied in an input substrate step 502. The ultra-low expansion substrate 202 can be cleaned in a back-side cleaning step 504 and front-side can be cleaned in a front-side cleaning step 506.

The steps of forming a capped Bragg reflector 508 are better performed in the integrated EUV mask blank production system 100 of FIG. 1 while under continuous vacuum to avoid contamination from ambient conditions.

The substrates 105 can be degassed and pre-cleaned in a vacuum cleaning step 510 performed in the degas subsystem 118. The backside chucking layer 214 can be deposited in a deposit backside chucking layer step 512 and planarization occurs in a planarization step 514. The planarization layer 204 of FIG. 2 can be cured in a planarization curing step 516, which can be performed in the cure subsystem 130. The deposition of the multi-layer stack 206 of FIG. 2 can be performed in a depositing the multi-layer stack step 518 and the capping layer 208 of FIG. 2 can be deposited in a depositing a cap deposition step 520 for forming the second in-process substrate 136.

While the DUV/Actinic inspection may be performed inside the integrated EUV mask blank production system 100, it may occur also outside in an inspection step 522. The second in-process substrate 136 can be optionally cleaned in a second cleaning step 524, and the absorber layer 210 of FIG. 2 and anti-reflective coating 212 of FIG. 2 can be deposited in an EUV mask blank completion step 526.

Figure 6:
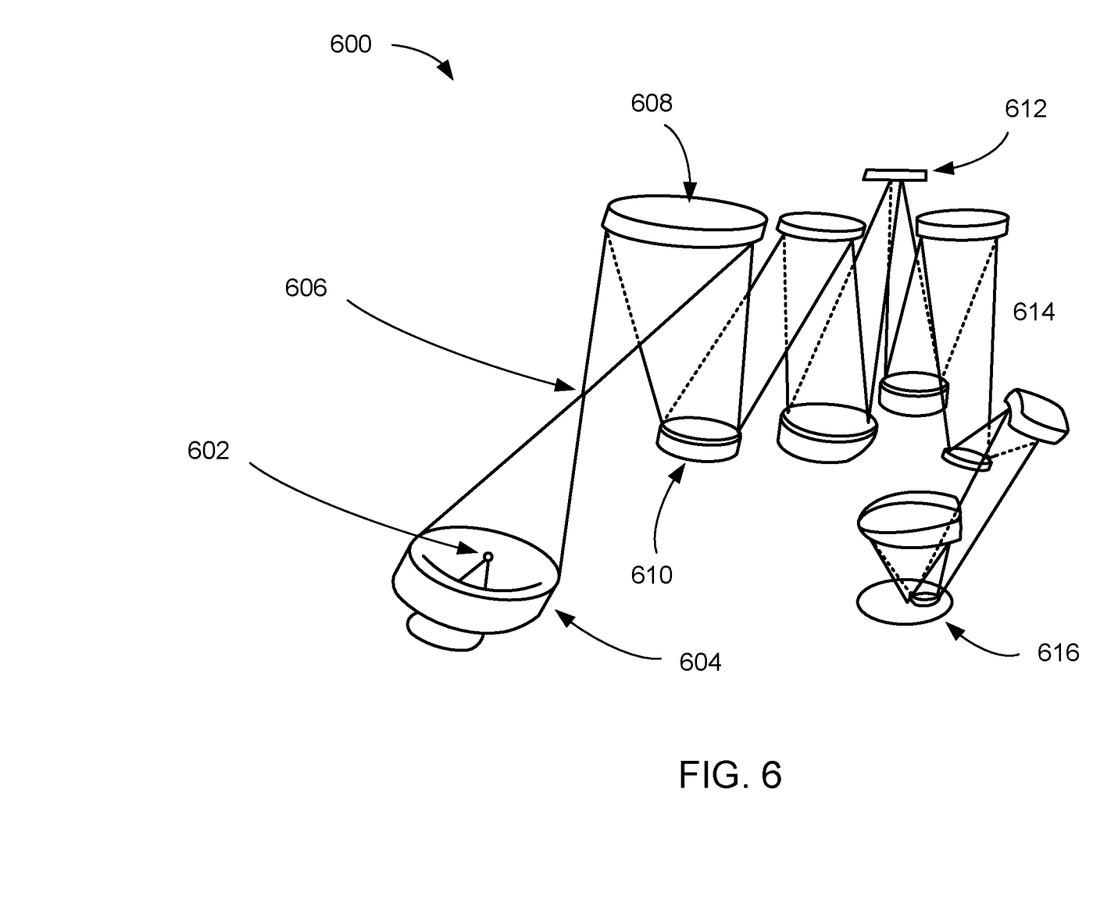
FIG. 6 is a functional diagram of an optical train for an EUV lithography system.

Referring now to FIG. 6, therein is shown a functional diagram of an optical train 600 for an EUV lithography system. The optical train 600 has an extreme ultraviolet light source 602, such as a plasma source, for creating the EUV light and collecting it in a collector 604. The collector 604 can have a parabolic shape for focusing the EUV light on a field facet mirror 608. The collector 604 provides the light to the field facet mirror 608 which is part of an illuminator system 606.

The surface of the field facet mirror 608 can have a concave contour in order to further focus the EUV light on a pupil facet mirror 610. The illuminator system 606 also includes a series of the pupil facet mirror 610 for transferring and focusing the EUV light on a reticle 612 (which is the fully processed version of the substrates 105 of FIG. 1).

The reticle 612 can have a pattern that represents a processing layer of an integrated circuit. The reticle 612 reflects the EUV, light including the pattern, through projection optics 614 and onto a semiconductor substrate 616. The projection optics 614 can reduce the area of the pattern provided by the reticle 612 and repeatedly expose the pattern across the surface of the semiconductor substrate 616.

Figure 7:
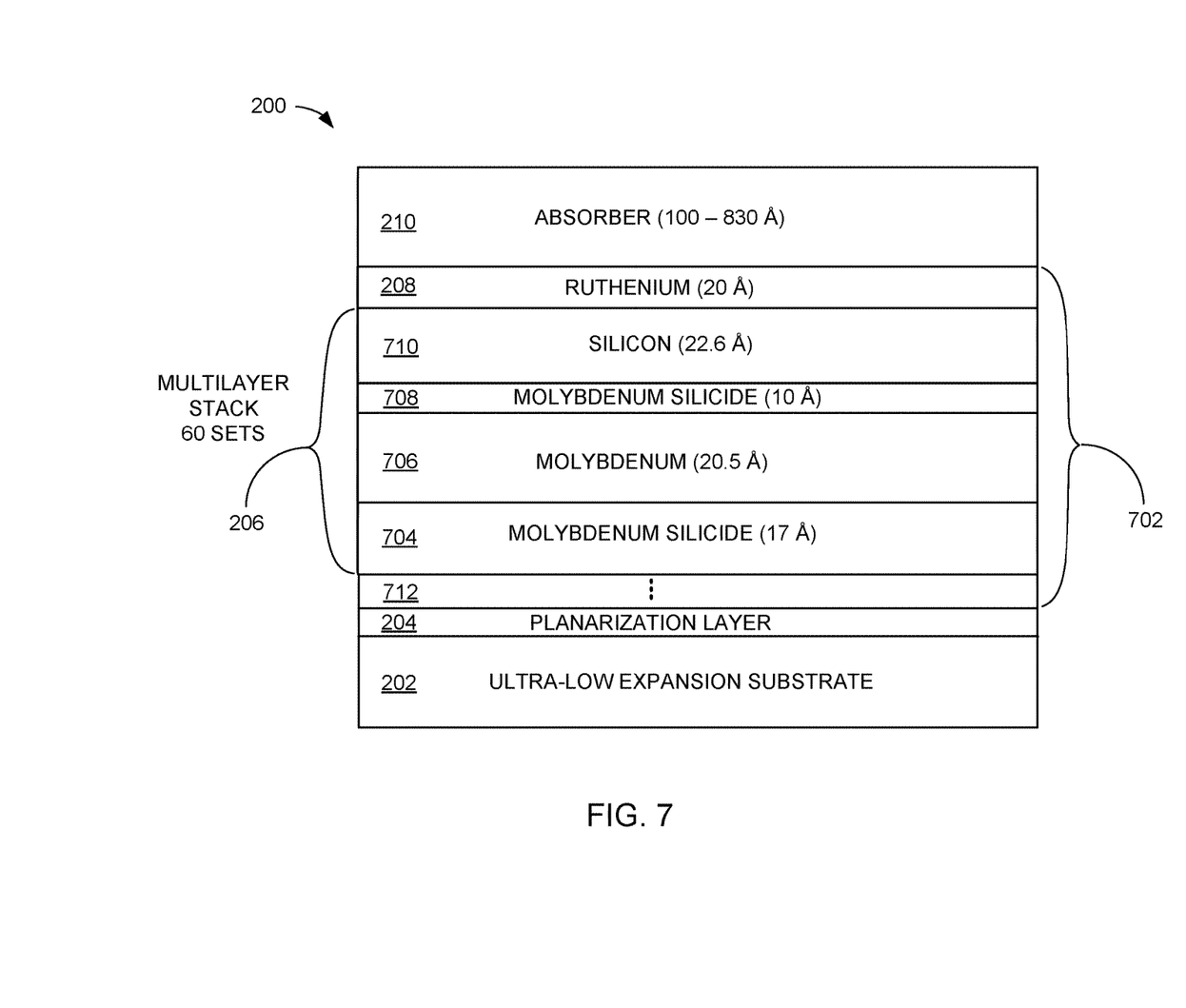
FIG. 7 shows a schematic view of an EUV mask blank including an absorber layer in an embodiment.

Referring now to FIG. 7, therein is shown a schematic view of the EUV mask blank 200 including the absorber layer 210 in an embodiment. Several candidates for the absorber layer are documented in this invention. The absorber layer 210 can be patterned to control absorption and dispersion of 13.5 nm light in single layers of metals and semimetals. The absorber layer 210 can be deposited on a capped Mo/Si multi-layer stack 702 opposite the ultra-low expansion substrate 202. An embodiment provides that the capping layer 208 can be a thin Ruthenium layer of 2.5 to 3 nm in thickness.

The behavior of the absorber layer 210 can be predicted on the capped Mo/Si multi-layer stack 702. The multi-layer stack 206 can be replicated 60 or more times, with a 1.7 nm layer of a molybdenum silicide layer 704 at the base of each interface. As an example, an embodiment of each of the multi-layer stack 206 includes a 2 nm layer of a Molybdenum (Mo) layer 706 formed on the molybdenum silicide layer 704. A 1 nm layer of a Molybdenum Silicide (MoSi) layer 708 formed on the Molybdenum (Mo) layer 706. A Silicon (Si) layer 710 of a 2.26 nm thick layer can be formed at the top of each of the multi-layer stack 206.

An additional multi-layer stack 712 can be formed directly on the planarization layer 204. It is understood that the additional multi-layer stack 712 can include up to 60 of the multi-layer stack 206 formed in a vertical stack above the ultra-low expansion substrate 202.

As an example, the thickness 211 of the absorber layer 210 can be in the range of between 10 nm and 83 nm, in order to provide between 95% and 99.5% absorption of the EUV light at 13.5 nm. The percent of reflectivity, provided by the EUV mask blank 200, can be controlled by managing the thickness 211 of the absorber layer 210. By way of an example, percent of reflectivity of the EUV light at the wavelength of 13.5 nm can be controlled to 5%, 3%, 1%, or 0.5% based on the thickness 211 of the absorber layer 210, as shown in Table 1.

All the reflectivity results can be verified with the Fresnel equations at each interface using the Parratt's exact recursive method. The following metals Nickel (Ni), Platinum (Pt), Silver (Ag), Zinc (Zn), Tin (Sn), Gold (Au), Hafnium (Hf), Lead (Pb), Indium (In), Cadmium (Cd) along with semimetals Bismuth (Bi), Antimony (Sb), and Tellurium (Te) are chosen, for use in the absorber layer 210, for their absorption characteristics at 13.5 nm and for their etchability. The absorber layer 210 can have a thickness 211 in the range of 31 nm to 83 nm to establish a maximum percent of absorption, greater than or equal to 99%, of the EUV light at the wavelength of 13.5 nm. The absorber layer 210 can be deposited by PVD, CVD, ALD, RF and DC magnetron sputtering techniques. These metals can form a very thin layer of native oxide, which has very little affect on the absorption and phase shift behavior at a wavelength of 13.5 nm. Table 1 gives the required thickness 211 for each metal to achieve an overall reflectivity of 5, 3, 1, and 0.5%.

TABLE 1

| Absorber | Thickness (nm) required to achieve reflectivity of | | | |
|---|---|---|---|---|
|  | 5% | 3% | 1% | 0.5% |
| Ni | 17.95 | 18.9 | 32.7 | 40.5 |
| Pt | 20.2 | 27.5 | 43.6 | — |
| Ag | 13 | 19.9 | 35.5 | — |
| Zn | 24.2 | 30.7 | 39.1 | 52.5 |
| Sn | 18.1 | 19.1 | 33 | 40.9 |
| Au | 20.7 | 28 | 50.6 | — |
| Hf | 39.1 | 46.5 | 67.7 | 82.2 |
| Pb | 26 | 33 | 48 | 62.7 |
| In | 18.5 | 19.4 | 33.6 | 48.2 |
| Cd | 19.9 | 26.8 | 41.5 | 56.4 |
| Bi | 24.8 | 26.2 | 40.4 | 54.6 |
| Sb | 18.3 | 24.8 | 33 | 40.7 |
| Te | 17.4 | 18.4 | 31.5 | 38.8 |

The atomic scattering factors of these chosen elements have higher real and imaginary parts than most elements in the periodic table. The higher imaginary part accounts for the absorption and the real part corresponds to the ability to modulate the phase of the incident EUV light. The phase modulation also depends on the thickness 211 of the absorber layer 210, since it's related to the path difference induced phase shift.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An extreme ultraviolet (EUV) EUV lithography system comprising:
    an extreme ultraviolet light source; and
    a reticle comprising an ultra-low expansion substrate; a multi-layer stack over the ultra-low expansion substrate; and an absorber layer, over the multi-layer stack, with a thickness of less than 80 nm and less than 2% reflectivity of an extreme ultraviolet (EUV) light at a wavelength of 13.5 nm, wherein the absorber layer includes a single layer of Tin (Sn), Lead (Pb), Hafnium (Hf), Bismuth (Bi), Antimony (Sb), or Tellurium (Te).

2. The system as claimed in claim 1 further comprising a capping layer between the multi-layer stack and the absorber layer, for protecting the multi-layer stack.

3. The system as claimed in claim 1, further comprising an additional multi-layer stack formed between the ultra-low expansion substrate and the absorber layer.

4. The system as claimed in claim 1, further comprising an additional multi-layer stack formed directly on a planarization layer and the multi-layer stack formed on the additional multi-layer stack.

5. The system as claimed in claim 1, further comprising an additional multi-layer stack.

6. The system as claimed in claim 1, wherein the absorber layer includes a single layer of Tin (Sn).

7. The system as claimed in claim 1, wherein the absorber layer includes a single layer of Lead (Pb).

8. The system as claimed in claim 1, wherein the absorber layer includes a single layer of Hafnium (Hf), Bismuth (Bi), Antimony (Sb), or Tellurium (Te).

9. The system as claimed in claim 1, wherein the absorber layer is in a range of 10 nm to 83 nm thick.

10. The system as claimed in claim 1, further comprising an anti-reflective coating on the absorber layer.

11. The system of claim 10, wherein the antireflective coating is selected from tantalum oxynitride and tantalum boron oxide.

12. The system as claimed in claim 1, wherein the reticle has a pattern that represents a processing layer of an integrated circuit.

13. The system as claimed in claim 12, further comprising projection optics and wherein the reticle reflects EUV light.

14. The system as claimed in claim 13, wherein the projection optics reduces area of the pattern provided by the reticle.

15. An extreme ultraviolet (EUV) EUV lithography system comprising:
an extreme ultraviolet light source;
a reticle comprising an ultra-low expansion substrate; a multi-layer stack over the ultra-low expansion substrate; and an absorber layer, over the multi-layer stack, with a thickness of less than 80 nm and less than 2% reflectivity of an extreme ultraviolet (EUV) light at a wavelength of 13.5 nm, wherein the absorber layer includes a single layer of Nickel (Ni), Platinum (Pt), Silver (Ag), Zinc (Zn), Tin (Sn), Lead (Pb), Indium (In), Hafnium (Hf), Cadmium (Cd), Bismuth (Bi), Antimony (Sb), or Tellurium (Te); and
an anti-reflective coating on the absorber layer, the anti-reflective coating selected from tantalum oxynitride and tantalum boron oxide.

16. The system as claimed in claim 15, wherein the absorber layer is in a range of 10 nm to 83 nm thick.

17. The system as claimed in claim 15, wherein the absorber layer includes a single layer of Silver (Ag), Zinc (Zn), or Tin (Sn).

18. The system as claimed in claim 15, wherein the absorber layer includes a single layer of Lead (Pb).

19. The system as claimed in claim 15, wherein the absorber layer includes a single layer of Hafnium (Hf), Bismuth (Bi), Antimony (Sb), or Tellurium (Te).

* * * * *

UNITED STATES PATENT AND TRADEMARK OFFICE
CERTIFICATE OF CORRECTION

PATENT NO. : 10,197,907 B2  
APPLICATION NO. : 15/438248  
DATED : February 5, 2019  
INVENTOR(S) : Vinayak Vishwanath Hassan et al.

Page 1 of 1

It is certified that error appears in the above-identified patent and that said Letters Patent is hereby corrected as shown below:

In the Claims

In Column 10, Claim 15, Line 8, after "Tin (Sn)," insert -- Gold (Au) -- therefor.

Signed and Sealed this  
Twenty-sixth Day of March, 2019

Andrei Iancu  
*Director of the United States Patent and Trademark Office*